(12) United States Patent
Fischer

(10) Patent No.: US 6,411,837 B1
(45) Date of Patent: Jun. 25, 2002

(54) METHOD FOR CHRONOLOGICALLY HIGH-RESOLUTION MAGNETIC RESONANCE TOMOGRAPHY OF THE FEMALE BREAST

(75) Inventor: Hubertus Fischer, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/270,353

(22) Filed: Mar. 16, 1999

(30) Foreign Application Priority Data

Mar. 16, 1998 (DE) .......................... 198 11 376

(51) Int. Cl.⁷ .............................. A61B 5/055
(52) U.S. Cl. ...................... 600/420; 324/309
(58) Field of Search ................ 600/410, 411, 600/413, 425, 420; 324/307, 309; 378/62–65, 37

(56) References Cited

U.S. PATENT DOCUMENTS

| | | | |
|---|---|---|---|
| 4,871,966 A | | 10/1989 | Smith et al. |
| 4,994,743 A | * | 2/1991 | Glover et al. ............... 324/309 |
| 5,251,629 A | * | 10/1993 | Koizumi et al. ............ 600/410 |
| 5,278,506 A | * | 1/1994 | Schmitt ...................... 324/322 |
| 5,400,377 A | * | 3/1995 | Hu et al. ....................... 378/8 |
| 5,415,163 A | * | 5/1995 | Harms et al. ............... 600/410 |
| 5,436,562 A | * | 7/1995 | Dumoulin ................... 324/306 |
| 5,590,655 A | * | 1/1997 | Hussman ..................... 606/130 |
| 5,613,492 A | * | 3/1997 | Feinberg ..................... 600/410 |
| 5,678,549 A | * | 10/1997 | Heywang-Koebrunner . 606/130 |
| 5,687,725 A | * | 11/1997 | Wendt ......................... 600/410 |
| 5,913,863 A | * | 6/1999 | Fischer et al. .............. 600/417 |

FOREIGN PATENT DOCUMENTS

| | | |
|---|---|---|
| DE | PS 43 37 503 | 2/1995 |
| DE | PS 37 17 871 | 5/1995 |

OTHER PUBLICATIONS

"MR Characterization of Suspicious Breast Lesions with a Gadolinium–enhanced TurboFLASH Subtraction Technique," Boetes et al., Radiology, vol. 193 (1994), pp. 777–781.

"Breast Neoplasms: T2* Susceptibility–Contrast, First–Pass Perfusion MR Imaging," Kuhl et al., Radiology, vol. 202 (1997), pp. 87–95.

* cited by examiner

*Primary Examiner*—Ruth S. Smith
(74) *Attorney, Agent, or Firm*—Schiff Hardin & Waite

(57) ABSTRACT

In a method for the chronologically high-resolution magnetic resonance tomography of the female breast, a number of chronologically successive images of the breast are produced in a first slice orientation, and at least one tomogram is produced with a time correlation to the first images and in a perpendicular orientation relative to the first slice orientation.

5 Claims, 1 Drawing Sheet

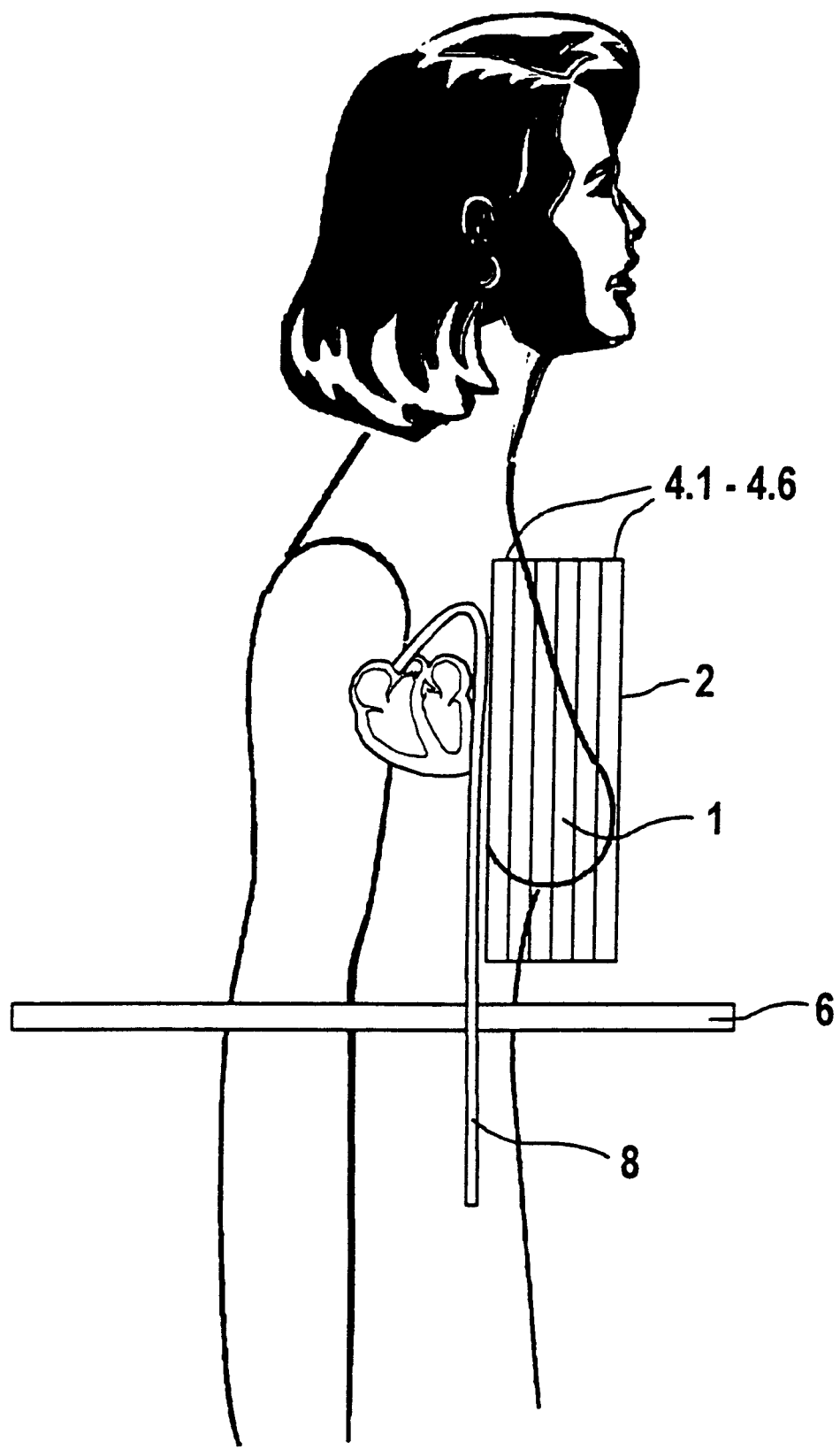

METHOD FOR CHRONOLOGICALLY HIGH-RESOLUTION MAGNETIC RESONANCE TOMOGRAPHY OF THE FEMALE BREAST

BACKGROUND OF THE INVENTION

1. Field of the Invention

The present invention is directed to a method for chronologically high-resolution magnetic resonance tomography, particularly of the female breast.

2. Description of the Prior Art

Primary tumor diagnosis in the female breast with the aid of nuclear spin tomography, i.e., magnetic resonance tomography (MRT), occurs by means of a dynamic investigation in which the enhancement behavior of a paramagnetic contrast agent is evaluated. The contrast agent is injected into a vein in the arm in a small dose—on the order of 20 mL. As a secondary injection, a physiological saline solution is used, so that the contrast agent reaches the blood circulation completely. The respective shortening of the relaxation times by the contrast agent is exploited for purposes of imaging. Given lower contrast agent concentration, primarily the T1 time is shortened; given higher concentration, the T2*—time is shortened. Given typical sequences, such as the spin-echo sequence or the gradient echo sequence, the shortening of T1 leads to a signal rise, while the T2* effect produces a signal reduction.

Although T1-sensitive sequences are generally used in dynamic contrast agent examinations, T2*-sensitive sequences such as echo planar imaging (EPI) can be utilized.

The contrast agent examinations are preferably conducted bilaterally, i.e. both breasts simultaneously. This saves examination time, since, given a unilateral examination, due to the use of the contrast agent, the second breast can not be examined immediately after the first. In addition, the patient is not stressed by a second injection. The MR imaging can then ensue either in the transversal or the coronary slice orientation. The coronary orientation has the advantage that a rectangular field of view can be selected, thereby halving the measuring time compared to the transversal orientation without a reduction of the spatial resolution.

Recent work suggests that a high time resolution in the imaging of the examined region in the area of 2 s, can improve the specificity of the contrast agent method. This method uses the flow of the contrast agent through the aorta as a time reference. To achieve such a time resolution, the transversal orientation has been selected, in order to image the aorta simultaneously. This kind of method is described in the article: "MR Characterization of Suspicious Breast Lesions with a Gadolinium-enhanced TurboFLASH Subtraction Technique" (Boetes; *Radiology*, 1994; 193: 777–781).

Another method in magnetic resonance tomography of the breast which uses a time resolution on the same order of magnitude is described in the article "Breast Neoplasms: T2* Susceptibility-Contrast, First-Pass Perfusion MR Imaging" (Kuhl, *Radiology*, 1997;202, No.1:87–95). There, the T2* effect of the contrast agent is used to determine the perfusion of a lesion. Basically, the contrast agent shortens both the T1 and the T2* times. In the T1-weighted image, a signal rise occurs, while in the T2*-weighted image, the shortening of the T2* time creates a signal drop. This effect dominates given high contrast agent concentrations. It is also stated that there is not a linear relation between contrast agent enhancement and perfusion in the T1-weighted image. Nevertheless, T1-weighted images are usually faster to create and do not require such a high equipment outlay as the creation of T2*-weighted images. One exception is EPI, which permits rapid imaging, but which is susceptible to artefacts and places high demands on equipment technology.

U.S. Pat. No. 4,871,966 describes how image data are obtained from different slices within a scan, these slices having different angles relative to one another.

German PS 37 17 871 teaches a method and an apparatus for the reproducible optical display of a surgical intervention. To this end, tomograms of the corresponding body region are prepared and stored, at least three measuring points being marked, fixed, or defined on the body part.

German PS 43 37 503 describes a method for spatially resolved blood flow measurement by means of NMR. To shorten the measuring time, while the maximum amplitude of the phase coding gradient remains constant, the number of phase coding steps is reduced relative to a number of steps required for the generation of a square field of view to such an extent that essentially only the examined blood vessel is covered in the phase coding direction.

SUMMARY OF THE INVENTION

An object of the present invention is to provide a method for chronologically high-resolution magnetic resonance tomography of the female breast.

The inventive method for achieving this object includes the following steps. A number of chronologically sequential images of the breast in a first slice orientation are produced. At least one tomogram is produced with a time correlation to the images and in perpendicular orientation relative to the first slice orientation. This tomogram, which is oriented perpendicularly to the first slice orientation, is positioned such that the contrast agent in the aorta can be detected. The appearance of the contrast agent bolus in the tomogram can then be used as a time reference for the successive images of the breast in the first slice orientation. The detected contrast agent bolus then also can be used to check whether the contrast agent has reached the bloodstream entirely.

In one embodiment, the tomogram is positioned such that it does not intersect the images in the first slice orientation. The magnetic resonance signals for the projections and the tomogram which is perpendicular thereto thus can be acquired chronologically interleaved, i.e., magnetic resonance signals from one volume element can be measured while the state of equilibrium of the nuclear spin has not yet been reached again in the other volume element. The overall time for the production of a number of images thus can be shortened.

In another embodiment, the images and the perpendicularly oriented tomogram are produced in alternation. Thus, all the magnetic resonance tomograms are available to an examiner in order to be able to analyze the enhancement behavior of the contrast agent.

DESCRIPTION OF THE DRAWINGS

The single figure is a side view of an examination subject with schematically indicated image slices and a perpendicularly oriented tomogram, for explaining the inventive method.

DESCRIPTION OF THE PREFERRED EMBODIMENTS

With the inventive method, the enhancement behavior of a paramagnetic contrast agent in a chronologically high-resolution magnetic resonance tomography can be imaged in the female breast. Both breasts are simultaneously examined in a coronary slice orientation. To shorten the measurement time, measurement occurs with a rectangular field of view, the height of the rectangular field of view being approximately halved compared to a square field of view. The appearance of the contrast agent bolus in the aorta is used as a time reference. In order to avoid movement artefact in the magnetic resonance tomograms, the patient is normally examined in the standing (vertical) orientation. A T1-weighted gradient echo sequence is offered for the imaging of the tomograms. Other sequences can also be used, however, such as FLASH (Fast Low Angle Shot), T1-FFE (Fast Field Echo) or SPGR (Spoilt Gradient Echo) sequences. The turbo FLASH sequence permits an extremely rapid measurement of selected slices, given a small injection of contrast agent, though high contrast agent enhancements can not be distinguished well.

The selected slice density of the coronary tomograms is determined by the size of the lesions to be detected, and by the thickness of the overall volume.

The FIGURE depicts a side view of a slice block 2, for which a coronary position in the examined region 1 is selected. The slice block 2 comprises six adjacent slices 4.1 to 4.6, of which tomograms are produced by magnetic resonance. A transversal slice 6 is imaged perpendicular to the slice block 2 and does not intersect this coronary slice block 2. The transversal slice 6 images the aorta 8 and serves as a time reference for the projections of the slice block 2 subsequent to the appearance of the contrast agent bolus. The tomograms in the individual measurement slices 4.1 to 4.6 and 6 can be imaged using an interleaved multi-slice method. The tomograms of the measurement slices thus are produced not strictly in succession, but interleaved, thereby reducing the measurement time considerably.

In an interval of about 2 s, the dynamic contrast agent study produces a complete imaging of the measurement slice block 2 and of the transversal slice 6, in order to be able to analyze the enhancement behavior of a tumor, if present.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance tomography, comprising the steps of:

introducing a contrast agent into a subject;

producing a plurality of chronologically successive images of a breast of said subject in a first slice orientation;

producing at least one tomogram in a perpendicular orientation relative to said first slice orientation; and detecting an occurrence of said contrast agent in said tomogram and using said occurrence as a time reference for the successive images of the breast in said first slice orientation.

2. A method as claimed in claim 1 comprising producing the images and the perpendicularly oriented tomogram in alternation.

3. A method as claimed in claim 1 comprising producing said plurality of chronologically successive images in a coronary orientation as said first slice orientation.

4. A method as claimed in claim 1 comprising producing said plurality of chronologically successive images with a rectangular field of view.

5. A method as claimed in claim 1 wherein the chronologically successive images and the perpendicularly oriented tomogram do not intersect.

* * * * *